(12) United States Patent
Hudson (10) Patent No.: US 7,064,549 B1
(45) Date of Patent: Jun. 20, 2006

(54) NMR RF COILS WITH SPLIT MOVABLE CAPACITANCE BANDS

(75) Inventor: Alexander M J Hudson, San Francisco, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 11/037,605

(22) Filed: Jan. 18, 2005

(51) Int. Cl.
*G01V 3/00* (2006.01)

(52) U.S. Cl. ...................................... 324/318; 324/321
(58) Field of Classification Search ................ 324/318, 324/321, 322
See application file for complete search history.

(56) References Cited

U.S. PATENT DOCUMENTS

| | | | | |
|---|---|---|---|---|
| 5,394,088 | A * | 2/1995 | Cory | 324/322 |
| 6,236,206 | B1 * | 5/2001 | Hartman et al. | 324/318 |
| 6,498,487 | B1 * | 12/2002 | Haner | 324/318 |
| 6,917,201 | B1 * | 7/2005 | de Swiet | 324/321 |

OTHER PUBLICATIONS

Article by Alderman and Grant, entitled "An Efficient Decoupler Coil Design which Reduces Heating in Conductive Samples in Superconducting Spectrometers", published in the Journal of Magnetic Resonance, 36, pp. 447-451 (1979).

\* cited by examiner

*Primary Examiner*—Louis M. Arana
(74) *Attorney, Agent, or Firm*—Bella Fishman; Andrei Popovici (57) ABSTRACT

A split capacitance-tuning band of a nuclear magnetic resonance (NMR) distributed-capacitance radio-frequency (RF) coil includes a fixed band and a longitudinally-movable (sliding) band, both disposed to overlap a central coil structure. The fixed band is situated along the boundary of the RF coil window. The movable band can move between a proximal position abutting the fixed band and various distal positions. The fixed band provides an RF current path close to the RF coil window, while the movable band allows tuning the coil capacitance and resonance frequency by varying the area of overlap between the movable band and the central coil structure. A longitudinal coupling member is attached to the movable band and to an actuator piston disposed under a probe lower insulator. A chip capacitor is connected between the coupling member and the actuator piston, to provide RF insulation for the movable capacitance band.

18 Claims, 8 Drawing Sheets

NMR RF COILS WITH SPLIT MOVABLE CAPACITANCE BANDS

RELATED APPLICATION DATA

This application is related to the U.S. patent application entitled "NMR RF Coils with Improved Low-Frequency Efficiency," by inventors Alexander M. J. Hudson and Knut Mehr, which is being filed on the same date as the present application and is assigned to the assignee of the present application.

FIELD OF THE INVENTION

The invention in general relates to nuclear magnetic resonance (NMR) spectroscopy, and in particular to systems and methods for improving the performance of tunable NMR radio-frequency (RF) coils.

BACKGROUND OF THE INVENTION

Nuclear magnetic resonance (NMR) spectrometers typically include a superconducting magnet for generating a static magnetic field $B_0$, and an NMR probe including one or more special-purpose radio-frequency (RF) coils for generating a time-varying magnetic field $B_1$ perpendicular to the field $B_0$, and for detecting the response of a sample to the applied magnetic fields. Each RF coil and associated circuitry can resonate at the Larmor frequency of a nucleus of interest present in the sample. Nuclei of interest analyzed in common NMR applications include $^1H$ (proton), $^{13}C$ (carbon), and $^{15}N$ (nitrogen). The RF coils are typically provided as part of an NMR probe, and are used to analyze samples situated in sample tubes or flow cells. The direction of the static magnetic field $B_0$ is commonly denoted as the z-axis or longitudinal direction, while the plane perpendicular to the z-axis is commonly termed the x-y or transverse direction.

Several types of RF coils have been used in NMR systems. In particular, many NMR systems include transverse-field RF coils, which generate an RF magnetic field oriented along the x-y plane. Transverse-field coils include saddle-shaped coils and birdcage coils. Birdcage coils typically include two transverse rings, and a relatively large number of vertical rungs connecting the rings. Birdcage coils are multiply-resonant structures in which specified phase-relationships are established for current flowing along multiple vertical rungs. Saddle-shaped coils normally have the current path defined by a conductor pattern around the coil windows. A particular type of saddle-shaped coil design is the Alderman-Grant coil design. An original Alderman-Grant coil design having two vertical rungs and chip capacitors was described by Alderman and Grant in their paper entitled "An Efficient Decoupler Coil Design which Reduces Heating in Conductive Samples in Superconducting Spectrometers," *J. Magnetic Resonance* 36:447–451 (1979). Other Alderman-Grant coil designs can have vertical slots defined in the vertical rungs, and can employ distributed capacitance structures rather than discrete chip capacitors.

An NMR frequency of interest is determined by the nucleus of interest and the strength of the applied static magnetic field $B_0$. In order to maximize the accuracy of NMR measurements, the resonant frequency of the excitation/detection circuitry is set to be equal to the frequency of interest. The resonant frequency of the excitation/detection circuitry varies as $$v = 1/2\pi\sqrt{LC} \qquad [1]$$

where L and C are the effective inductance and capacitance, respectively, of the excitation/detection circuitry.

Generating high-resolution NMR spectra is facilitated by employing a temporally and spatially-homogeneous static magnetic field. The strength of the static magnetic field can vary over time due to temperature fluctuations or movement of neighboring metallic objects, among others. Spatial variations in the static magnetic field can be created by variations in sample tube or sample properties, the presence of neighboring materials, or by the magnet's design. Minor spatial inhomogeneities in the static magnetic field are ordinarily corrected using a set of shim coils, which generate a small magnetic field which opposes and cancels inhomogeneities in the applied static magnetic field. Temporal variations in the static magnetic field are commonly corrected using a field lock. Field lock circuitry monitors the resonance frequency of a reference (e.g. deuterium) signal, and adjusts the static magnetic field strength to keep the reference signal frequency constant. Deuterium is commonly added to sample solvents to provide the field lock reference signal.

In general, the field lock reference signal and the NMR measurement signal have different resonance frequencies. Consequently, if the same RF coil is used to acquire both the field lock and sample NMR signals, a conventional RF coil optimized for the sample resonance of interest may not be ideally suited for the field lock reference signals. In some NMR systems, a single coil may also be used to perform NMR measurements for multiple nuclei of interest. In such systems, the coil may not be ideally suited for all resonance frequencies of interest. Improving the performance of NMR systems over relatively broad tuning ranges would be useful for enhancing field lock accuracy, as well as improving single-coil, multi-nucleus NMR measurements.

SUMMARY OF THE INVENTION

According to one aspect, the present invention provides a nuclear magnetic resonance apparatus comprising a nuclear magnetic resonance radio-frequency coil having a split, part-movable capacitance band. The coil includes a distributed-capacitance central coil structure comprising a pair of longitudinally-spaced conductive rings including a first ring and a second ring, and plurality of longitudinal conductive segments each electrically interconnecting the first ring to the second ring. The first ring is band-shaped, and a coil window is defined in a space between the first ring and the second ring. The coil further includes a first ring-shaped capacitance band overlapping the first ring and having a first diameter; and a second ring-shaped capacitance band capable of overlapping the first ring. The second capacitance band has a second diameter substantially equal to the first diameter, is situated on a side of the first capacitance band opposite the coil window, and is longitudinally-movable between a proximal position and a distal position. The distal position is situated further away from the coil window than the proximal position. In the proximal position, the second capacitance band overlaps the first ring. Longitudinally moving the second capacitance band tunes a resonance frequency of the coil.

According to another aspect, the present invention provides a capacitance band assembly for tuning a nuclear magnetic resonance radio-frequency coil, comprising: a first ring-shaped capacitance band sized to overlap a band-shaped part of the coil; a second ring-shaped capacitance band sized to overlap the band-shaped part of the coil, the second capacitance band being longitudinally-movable between a proximal position and a distal position; a longitudinal coupling member rigidly coupled to the second capacitance band and extending away from the first capacitance band; and a longitudinal-motion actuator connected to the longitudinal coupling member opposite the second capacitance band, for driving a longitudinal motion of the second capacitance band between the proximal position and the distal position. The distal position is situated further away from the first capacitance band than the proximal position. In the proximal position, the second capacitance band overlaps the band-shaped part of the coil.

According to another aspect, the present invention provides a nuclear magnetic resonance method comprising: moving a second ring-shaped capacitance band between a proximal position and a distal position; and using the coil to perform a nuclear magnetic resonance measurement on a sample. A first ring-shaped capacitance band overlaps a band-shaped part of a nuclear magnetic resonance radio-frequency coil. In the proximal position, the second capacitance band overlaps the band-shaped part of the coil. The distal position is situated further away from the first capacitance band than the proximal position.

BRIEF DESCRIPTION OF THE DRAWINGS

The foregoing aspects and advantages of the present invention will become better understood upon reading the following detailed description and upon reference to the drawings where:

FIG. 2-A shows an isometric view of a part of a radio-frequency (RF) NMR coil assembly according to some embodiments of the present invention.

FIG. 2-B shows a longitudinal side view of the coil assembly part of FIG. 2-A.

FIG. 5-A shows an isometric view of a capacitance band assembly according to some embodiments of the present invention.

FIG. 5-B shows a longitudinal side view of the capacitance band assembly of FIG. 5-A in a proximal position, according to some embodiments of the present invention.

FIG. 5-C shows a longitudinal side view of the capacitance band assembly of FIG. 5-A in a distal position, according to some embodiments of the present invention.

FIG. 6-A is a schematic diagram of an RF coil circuit according to some embodiments of the present invention.

FIG. 6-B is a simplified schematic diagram of the circuit of FIG. 6-A according to some embodiments of the present invention.

FIG. 9-A shows recorded variations of coil Q-factors over a tuning range for a split-band coil and a comparable non-split-band coil, according to some embodiments of the present invention.

FIG. 9-B shows recorded variations of $B_1$ frequency shifts over a tuning range for a split-band coil and a comparable non-split-band coil, according to some embodiments of the present invention.

FIG. 9-C shows variations of coil efficiencies over a tuning range for a split-band coil and a comparable non-split-band coil, computed from the data of FIGS. 9-A–B, according to some embodiments of the present invention.

DETAILED DESCRIPTION OF THE INVENTION

In the following description, a set of elements includes one or more elements. Any reference to an element is understood to encompass one or more elements. Each recited element or structure can be formed by or be part of a monolithic structure, or be formed from multiple distinct structures. A longitudinally-monolithic foil is a foil that is not formed by connecting multiple longitudinally-separated parts; a longitudinally-monolithic foil may include multiple layers stacked along a non-longitudinal direction. The statement that a coil is used to perform a nuclear magnetic measurement on a sample is understood to mean that the coil is used as transmitter, receiver, or both. Unless otherwise stated, any recited electrical or mechanical connections can be direct connections or indirect connections through intermediary circuit elements or structures. A conductive ring is a structure that provides a ring-shaped current path to RF current; such a structure can include two or three concentric, capacitively-coupled physical rings, some or all of which may include longitudinal slots; such physical rings can be formed, for example, by parts of a central foil and/or a capacitive shield. A conductive ring can also include a single, monolithic physical ring providing a ring-shaped path to DC current. The statement that a longitudinal conductor electrically couples two conductive rings is understood to mean that the longitudinal conductor provides a current path for RF current flowing between the two rings. Such a longitudinal conductor can be physically (resistively) connected to one or both of the rings (providing both DC and RF current paths), or capacitively coupled to one or both of the rings. The statement that a band overlaps a conductive ring is understood to mean that at least part of the band overlaps at least part of the ring.

The following description illustrates embodiments of the invention by way of example and not necessarily by way of limitation.

Figure 1:
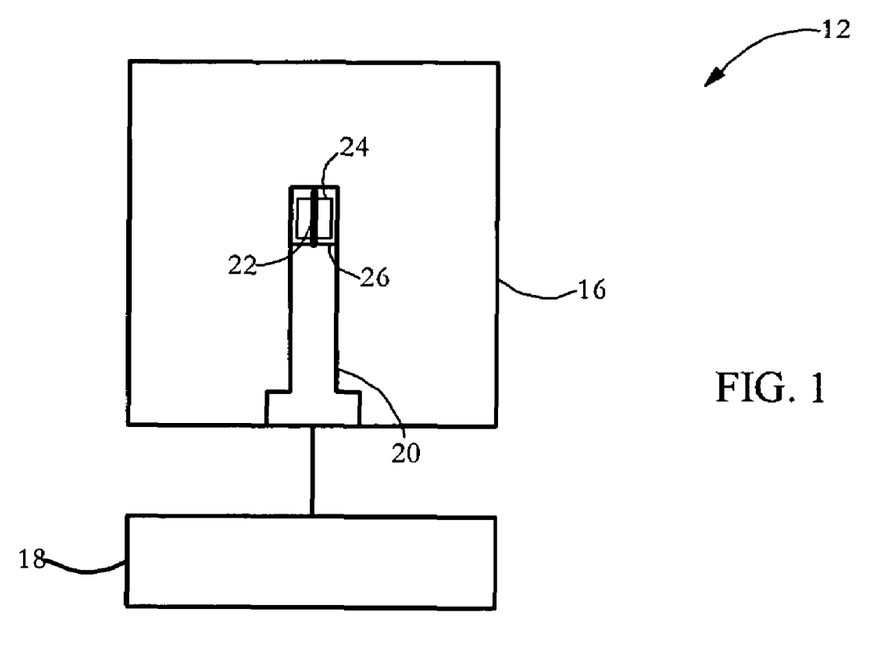
FIG. 1 is a schematic diagram of an exemplary NMR spectrometer according to some embodiments of the present invention.

FIG. 1 is a schematic diagram illustrating an exemplary nuclear magnetic resonance (NMR) spectrometer 12 according to some embodiments of the present invention. Spectrometer 12 comprises a magnet 16, an NMR probe 20 inserted in a cylindrical bore of magnet 16, and a control/acquisition system 18 electrically connected to magnet 16 and probe 20. Probe 20 includes one or more radio-frequency (RF) coils 24 and associated electrical circuit components. For simplicity, the following discussion will focus on a single coil 24, although it is understood that a system may include multiple nested RF coils. A sample container 22 is positioned within probe 20, for holding an NMR sample of interest within coil 24 while measurements are performed on the sample. Sample container 22 can be a sample tube or a flow cell. Coil 24 is disposed above a lower insulator 26, which includes a number of longitudinal apertures for passing various electrical connection therethrough. A number of electrical circuit components such as capacitors, inductors, and other components are disposed below lower insulator 26 and are electrically connected to coil 24. Coil 24 and the various components connected to coil 24 form one or more NMR measurement circuits, as well as a field lock circuit. Probe 20 includes additional conventional components, such as shim coils used to correct spatial inhomogeneities in the static magnetic field $B_0$.

To perform a measurement, a sample is inserted into a measurement space defined within coil 24. Magnet 16 applies a static magnetic field $B_0$ to the sample held within sample container 22. Control/acquisition system 18 comprises electronic components configured to apply desired radio-frequency pulses to probe 20, and to acquire data indicative of the nuclear magnetic resonance properties of the samples within probe 20. Coil 24 is used to apply radio-frequency magnetic fields $B_1$ to the sample, and/or to measure the response of the sample to the applied magnetic fields. The RF magnetic fields are perpendicular to the static magnetic field. The same coil may be used for both applying an RF magnetic field and for measuring the sample response to the applied magnetic field. Alternatively, one coil may be used for applying an RF magnetic field, and another coil for measuring the response of the sample to the applied magnetic field.

Coil 24 can be used for signals at multiple resonance frequencies. The multiple resonance frequencies can include a field lock signal frequency and/or one or more sample signal frequencies. In some embodiments, tuning the resonant frequency of a NMR measurement circuit that includes the coil can be achieved by adjusting the values of various variable capacitors included in the circuit, or by switching circuit components such as capacitors or inductors having different values into the circuit. In an exemplary implementation, coil 24 is used to perform proton NMR measurements and to maintain a lock on a deuterium signal. In other implementations, coil 24 can be used to perform NMR measurements at other or additional frequencies of interest. The discussion below will focus primarily on a system using a high-frequency proton signal and a lower-frequency deuterium lock signal. In an exemplary NMR system, proton and deuterium lock signals correspond to resonance frequencies of 800 MHz and 121.8 MHz, respectively.

Figure 2:
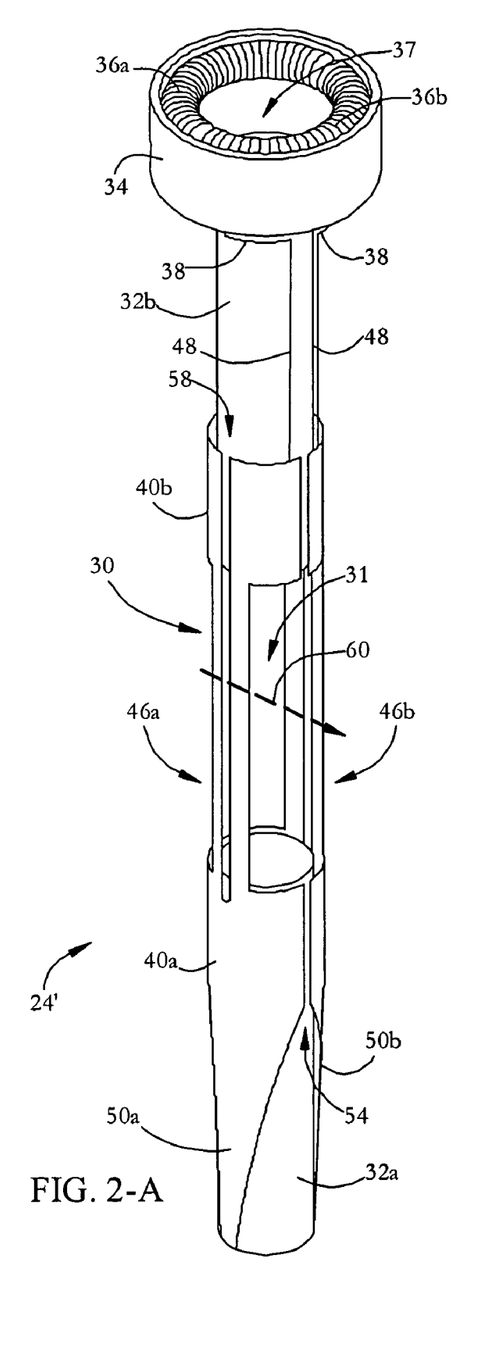
Figure 3:
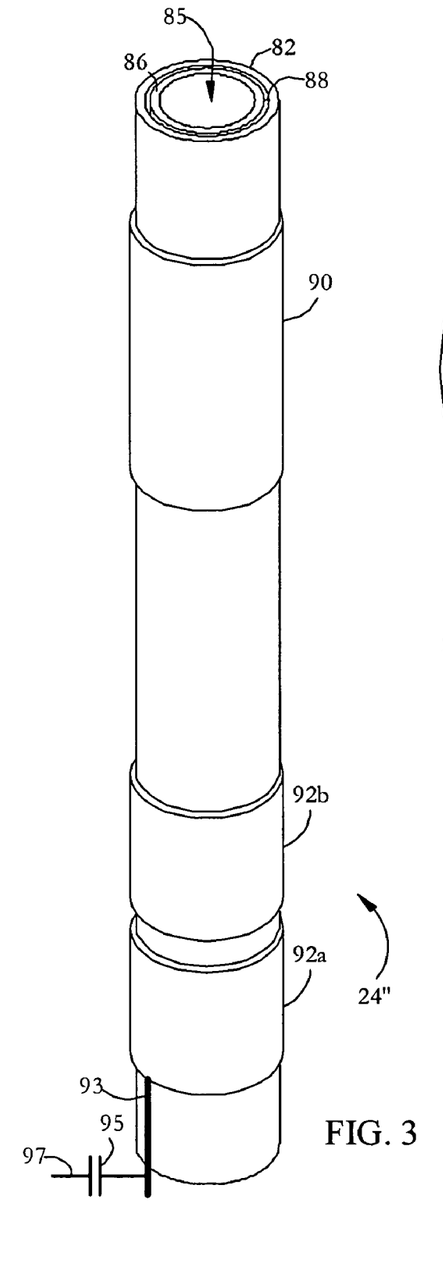
FIG. 3 shows an isometric view of a coil support for the coil assembly part of FIG. 2-A, and conductive capacitance bands (sleeves) mounted on the support, according to some embodiments of the present invention.

FIGS. 2-A and 2-B show isometric and longitudinal side views, respectively, of a radio-frequency (RF) coil assembly 24' according to some embodiments of the present invention. FIG. 3 shows an isometric view of a support assembly 24" comprising a pair of support tubes for mounting coil assembly 24' thereon, and a set of exterior capacitance bands. RF coil 24 is formed by assemblies 24', 24", as illustrated in a transverse sectional view in FIG. 4.

As shown in FIGS. 2-A–B, RF coil assembly 24' comprises a central coil structure 30, a pair of cylindrical floating shields 32a–b disposed on opposite longitudinal sides of central coil structure 30, an insulative auxiliary inductor support 34 mounted above central coil structure 30, a pair of auxiliary inductors 36a–b mounted on support 34, and a set of conductive leads 38 connecting central coil structure 30 and auxiliary inductors 36a–b as described below. In some embodiments, a single wire forms a pair of conductive leads 38 and a corresponding auxiliary inductor 36a–b. Central coil structure 30, shields 32a–b, conductive leads 38, auxiliary inductors 36a–b, and a set of capacitance bands 90, 92a–b (shown in FIG. 3) form conductive structure of RF coil 24.

A measurement volume 31 and a corresponding coil window are defined in the center of central structure 30, between shields 32a–b. The central axis of each shield 32a–b is aligned with the longitudinal central axis of central coil structure 30. The measurement volume 31 sequentially accommodates NMR samples of interest held in cylindrical sample tubes or flow cells. A longitudinal aperture 37 is defined through the center of auxiliary inductor support 34, to allow the passage of NMR sample tubes or flow cells. Shields 32a–b are capacitively coupled to central structure 30 along at least part of the surfaces of shields 32a–b adjacent to measurement volume 31. Shields 32a–b serve to reduce the parasitic excitation of the NMR samples due to RF pickup from coil leads or other conductive structures, and to shield the NMR samples from undesired external electric fields. Shields 32a–b also provide additional distributed capacitance to coil assembly 24'.

Central coil structure 30 has a generally saddle-shaped, modified Alderman-Grant coil form. Central coil structure 30 comprises a pair of generally-transverse, longitudinally-spaced lower and upper conductive rings 40a–b, respectively, a set of four longitudinal conductive segments (rungs, strips) 46a–b extending between and interconnecting ring 40a and ring 40b, a set of four longitudinal inductor-interconnect leads 48 extending upward from the upper ring 40b, and a pair of tapered external-connection leads 50a–b extending downward from lower ring 40a.

External connection leads 50a–b extend downward, longitudinally away from measurement volume 31, toward the distal end of shield 32a. Leads 50a–b are tapered, narrowing from top to bottom. Leads 50a–b provide an electrical connection to external drive/detection circuitry. Rings 40a–b are disposed on opposite sides of measurement volume 31, and are disposed around the proximal ends of shields 32a–b. Ring 40a has a pair of longitudinal slots (gaps) 54 defined therethrough. Slots 54 are situated on axially opposite sides of ring 40a, and extend along the entire longitudinal extent of ring 40a, so as to divide ring 40a into separate arcuate ring sections. Slots 54 prevent the direct flow of current through ring 40a around a complete circle. Ring 40b has a set of four longitudinal slots (gaps) 58 defined therethrough. Slots 58 are situated at 90° azimuthal positions along ring 40b, with two opposite slots 58 aligned with slots 54, and two opposite slots 58 along a perpendicular azimuthal direction. Slots 58 extend along the entire longitudinal extent of ring 40b, so as to divide ring 58 into separate arcuate ring sections. Slots 58 prevent the direct flow of current through ring 40b around a complete circle.

Each longitudinal segment 46a–b extends along measurement volume 31, between rings 40a–b. Rings 40a–b and segments 46a–b form a set of loops facing each other along a transverse (x- or y-) direction, for generating an RF magnetic field along that direction. An exemplary magnetic field general direction is schematically illustrated at 60 in FIG. 2-A. Current flows through the loops in the same direction (clockwise or counterclockwise), such that the RF magnetic fields generated by the two loops reinforce each other. A general direction of current flow corresponding to the magnetic field direction 60 is illustrated at 62 in FIG. 2-B.

Each inductor interconnect lead 48 extends longitudinally upward from upper ring 40b, away from measurement volume 31. In some embodiments, interconnect leads 48 are arranged in two pairs situated along opposite transverse sides of ring 40b. The leads of each pair are adjacent to and situated on opposite sides of a corresponding slot 58, which faces the coil window defining the magnetic field direction 60. In other embodiments, interconnect leads 48 can be positioned at other azimuthal positions. Each lead 48 is formed by a strip of metal which is preferably made as thin as mechanically feasible. Using thin leads, which have relatively low capacitance and high inductance, maximizes the impedance seen by high-frequency proton current as described in detail below.

Each inductor interconnect lead 48 is connected to a proximal end of a corresponding conductive lead 38. In some embodiments, conductive leads 38 are formed by susceptibility compensated wire, and leads 48 and 38 are soldered together. The attachment of leads 48, 38 preferably does not generate substantial resistive losses to proton current. The four leads 38 extend azimuthally along the top side of shield 32b for an angular extent of about 90°, then extend vertically through corresponding longitudinal apertures defined through inductor support 34, and are connected to corresponding terminals of inductors 36a–b. Each of the two pairs of leads 38 can be monolithically formed together with their corresponding inductor 36a–b from a single conductive wire. Each inductor 36a–b is shaped as a semicircle or half-toroid, with the inductor coil wire spun around a circumferential axis lying in a transverse plane. Inductors 36a–b together form an approximate full toroid shape, which facilitates optimal inductive coupling between inductors 36a–b.

Figure 4:
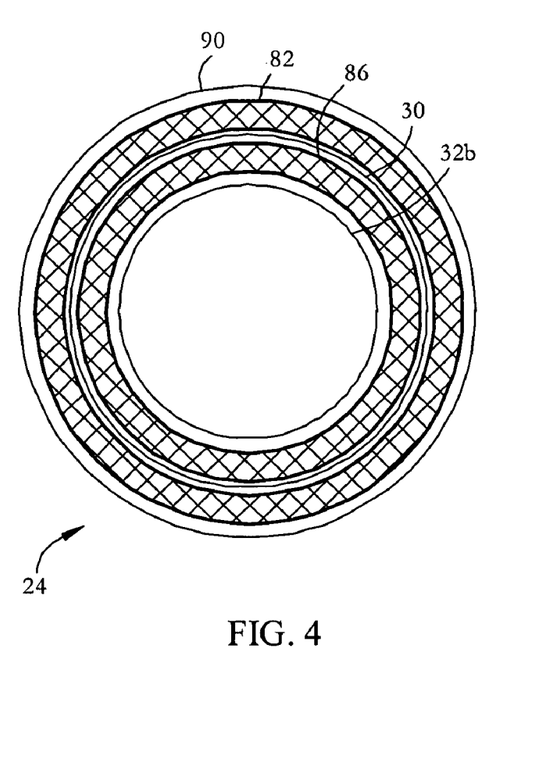
FIG. 4 shows a transverse sectional view of the a coil assembly including the coil assembly part of FIG. 2-A and the coil support and capacitance-tuning bands of FIG. 3, according to some embodiments of the present invention.

FIG. 3 shows an isometric view of coil support assembly 24", which is used to support and provide additional capacitance to coil assembly 24' in some embodiments of the present invention. FIG. 4 shows a transverse view of coil 24 including coil assembly 24' and coil support assembly 24". As illustrated in FIG. 3, coil support assembly 24" includes two outer and inner supports 82, 86, respectively. Supports 82, 86 are formed by hollow cylindrical generally-longitudinal shells, and are formed from non-conductive, dielectric material(s). An inner longitudinal bore defined within inner support 86 accommodates the sample tubes or flow cells of interest. Central coil structure 30 (shown in FIGS. 2-A–B) is disposed in a thin cylindrical space 88 defined between supports 82, 86. Shields 32a–b (FIGS. 2-A–B) are disposed along the inner surface of inner support 86.

A set of capacitance bands 90, 92a–b (shown in FIG. 3) are disposed along the outer surface of outer support 82. An upper capacitance band 90 is situated opposite measurement volume 31 relative to two lower capacitance bands 92a–b. Upper capacitance band 90 is situated along upper ring 40b and/or upper shield 32b. Lower capacitance bands 92a–b are positioned along lower ring 40a and/or lower shield 32a. Upper capacitance band 90 and lower capacitance band 92b are fixed, while lower capacitance band 92a is longitudinally-slidable along outer support 82. In some embodiments, lower capacitance band 92a is secured to a rigid, generally-longitudinal coupling member 93, which can be formed by a susceptibility-compensated rod-shaped wire. Coupling member 93 is used to slide capacitance band 92a longitudinally, in order to vary the amount of additional capacitance provided by capacitance band 92a. Coupling member 93 is secured to a mechanical actuator (e.g. an actuator piston) situated below lower insulator 26 (FIG. 1). The actuator is schematically represented in FIG. 3 by an actuator node 97. An isolation capacitor 95 is connected between actuator node 97 and coupling member 93, in order to enhance the RF isolation of capacitance band 92a.

Figure 5:
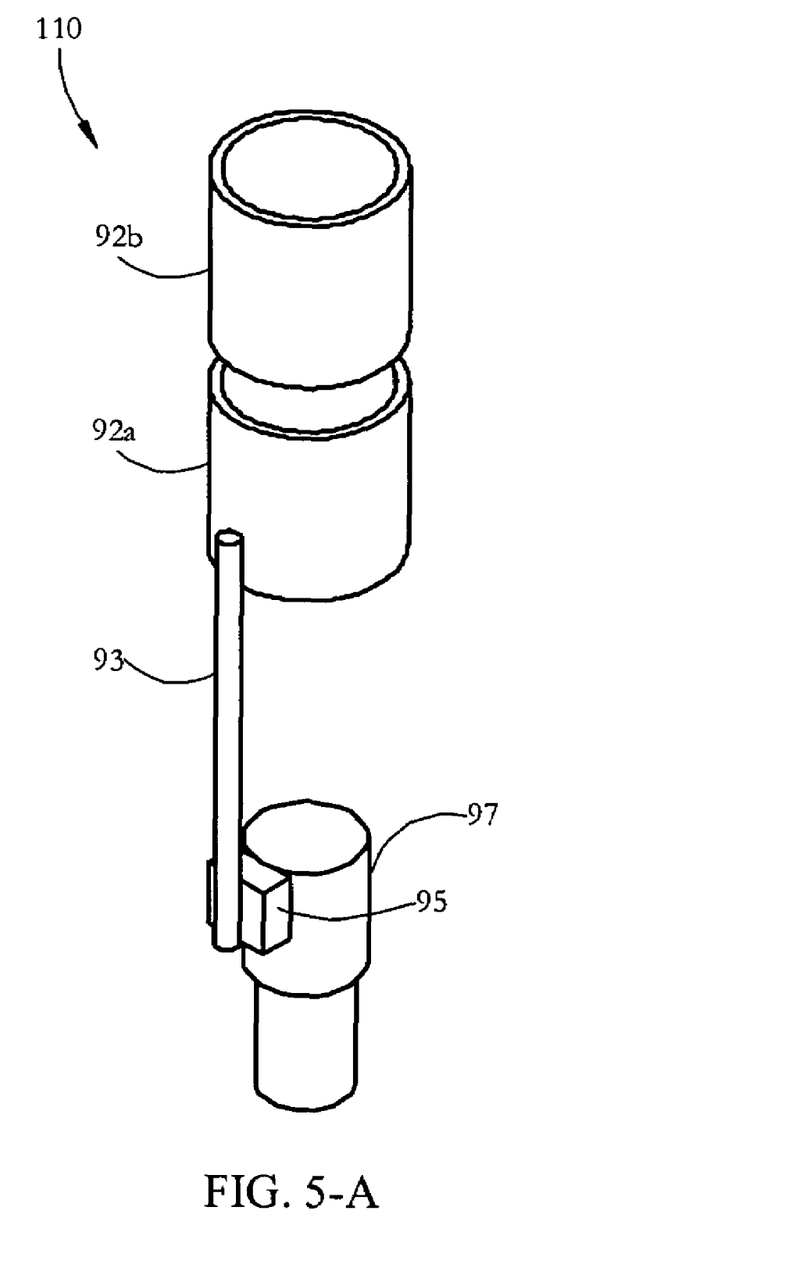

FIG. 5-A shows an isometric view of a capacitance-tuning assembly 110 comprising capacitance bands 92a–b, coupling member 93, isolation capacitor 95, and an actuator piston 97. Actuator piston 97 is can be formed from a conductive material such as a metal. Coupling member 93 is soldered along its longitudinal surface, at opposite ends, to capacitance band 92a and isolation capacitor 95. Isolation capacitor is soldered along two opposite longitudinal surfaces, between coupling member 93 and actuator piston 97.

FIGS. 5-B–C show longitudinal side views of capacitance-tuning assembly 110 and its relationship to lower insulator 26 and the coil assembly layers illustrated in FIG. 4. FIG. 5-B shows capacitance band 92a in a proximal position, adjacent to capacitance band 92b. In some embodiments, capacitance band 92a can also abut (physically touch) capacitance band 92b, and form essentially a single extended capacitance band together with capacitance band 92b. FIG. 5-C shows capacitance band 92a in an exemplary distal position, further away from capacitance band 92b and the coil window. Capacitance band 92a can be placed in a number of distal positions situated at various longitudinal locations, to provide a desired area of overlap between capacitance band 92a and central coil structure 30 and thus tune the coil resonant frequency. In the proximal position illustrated in FIG. 5-B, a relatively large area of capacitance band 92a overlaps central coil structure 30, along ring 40a and connection leads 50a–b (FIG. 2-A). In the exemplary distal position illustrated in FIG. 5-C, a smaller area of capacitance band 92a overlaps central coil structure 30 along connection leads 50a–b (FIG. 2-A).

The longitudinal extent of capacitance bands 92a–b can be chosen according to the desired tuning range, the longitudinal variation in overlap capacitance determined by the taper in the connection leads 50a–b (FIG. 2-A), and the longitudinal range of motion of actuator piston 97. In some embodiments, for example in a 800 MHz proton probe, a proton tuning range of about 8 MHz allows compensating for resonant frequency changes caused by lossy/dielectric samples. In other embodiments, for example in probes capable of tuning between proton and fluorine frequencies, a wider (longitudinally-bigger) movable capacitance band 92a can be used, and the taper in connection leads 50a–b can be reduced or eliminated.

As shown in FIGS. 5-B–C, coupling member 93 extends through a longitudinal aperture defined in lower insulator 26. Capacitance bands 92a–b are situated above lower insulator 26, while isolation capacitor 95 and actuator piston 97 are positioned below lower insulator 26. Actuator piston 97 can include or be rigidly attached to a longer longitudinal rod extending downward. Actuator piston 97 is capable of longitudinal motion driven by a linear motor or a stepper motor with a rotary-to-linear converter.

In some embodiments, a split capacitance band as shown in FIGS. 3 and 5-A–C can be employed on the non-drive side of the coil, i.e. on the top side of the coil shown in FIG. 2-A. A similar split capacitance band or a single fixed capacitance band can then be used on the drive (bottom) side of the coil. A top-side movable capacitance band can be moved using a coupling member extending through an aperture in an upper probe insulator. In a probe using sample tubes, a spinner turbine used to spin the sample tubes can place spatial constraints on the coupling member location and geometry. A flow cell probe may allow more space for inserting a coupling member from the top. An insulative coupling member can be desirable if the coupling member extends outside of the RF probe shield. A conductive coupling member extending outside the RF probe shield could conduct undesirable RF interference into the coil sample region.

Figure 6:
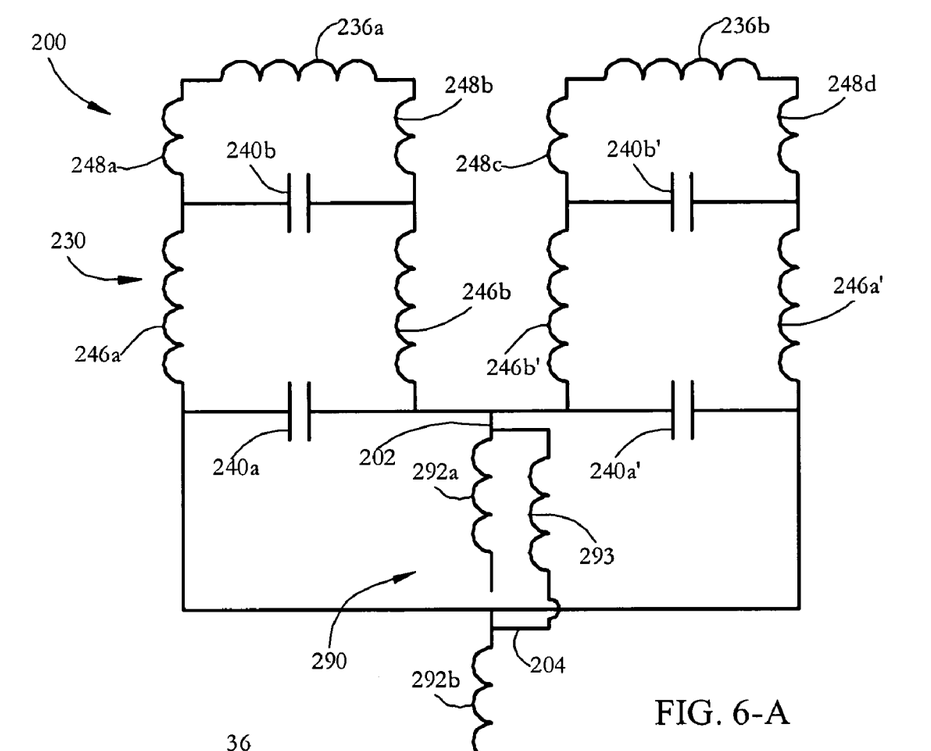

FIG. 6-A shows a schematic diagram of a coil circuit 200 defined by coil assembly 24' and associated external probe circuitry 290, according to some embodiments of the present invention. The numbers used for various circuit elements in FIG. 6-A correspond to like numbers used to denote the structures shown in FIG. 2-A. Two auxiliary inductors 236*a–b* are connected through a set of longitudinal leads represented by inductors 248*a–d* to a core circuit 230 formed generally by at least parts of central coil structure 30, shields 32*a–b* and capacitance bands 90, 92*a–b* (shown in FIGS. 2-A and 3). Core circuit 230 is connected to external circuitry across nodes 202, 204. A pair of lower capacitors 240*a*, 240*a'* are connected across nodes 202, 204; the capacitance of capacitors 240*a*, 240*a'* is provided generally by the overlapping parts of lower ring 40*a*, shield 32*a* (FIGS. 2-A–B) and capacitance bands 92*a–b* (FIG. 3). Longitudinally moving capacitance band 92*a* alters the capacitances of capacitors 240*a–a'*.

Two inductors 246*a–b* and an upper capacitor 240*b* are connected in series between nodes 202, 204. The inductance of inductors 246*a–b* is provided generally by the longitudinal segments 46*a–b* shown in FIGS. 2-A–B, while the capacitance of capacitor 240*b* is provided generally by an overlapping part of upper ring 40*b*, shield 32*b* (FIGS. 2-A–B) and capacitance band 90 (FIG. 3). The series circuit formed by inductors 236*a*, 248*a–b* is connected across upper capacitor 240*b*. Similarly, two inductors 246*a'*-b' and an upper capacitor 240*b'* are connected in series between nodes 202, 204. The inductance of inductors 246*a'*-b' is provided generally by the longitudinal segments 46*a–b* shown in FIGS. 2-A–B, while the capacitance of capacitor 240*b'* is provided generally by an overlapping part of upper ring 40*b*, shield 32*b* (FIGS. 2-A–B) and capacitance band 90 (FIG. 3). The series circuit formed by inductors 236*b*, 248*c–d* is connected across upper capacitor 240*b'*. Two lower lock (low-frequency) inductors 292*a–b* are connected between nodes 202, 204, respectively, and external circuitry. A shunt inductor 293 is connected between nodes 202, 204. Lower lock inductors 292*a–b* and shunt inductor 293 are physically located away from coil assembly 24', in a probe circuit region underneath the lower insulator 26 (FIG. 1).

FIG. 6-B shows a simplified diagram of a coil circuit 250 defined by a coil assembly according to some embodiments of the present invention. Coil circuit 250 includes an auxiliary inductor 36 and a core circuit 230'. Auxiliary inductor 36 can represent a single physical inductor or the equivalent inductance of multiple inductors such as inductors 36*a–b* (FIG. 6-A). Core circuit 230' is connected to external circuitry across external leads 202, 204. Inductors 246*a–b* and an upper capacitor 240*b* are connected in series between leads 202, 204.

Inductor 36 provides an auxiliary low-frequency current path 254 through coil circuit 250, running through inductors 246*a–b* and inductor 36. A coil circuit without auxiliary inductor 36 would only employ a central coil current path 252, running through inductors 246*a–b* and capacitor 240*b*. In the coil circuit 250, which includes auxiliary inductor 36, the auxiliary current path 254 is used preferentially by lower-frequency current, such as current corresponding to a locking signal, while central coil current path 252 is used preferentially by higher-frequency current.

The preferred systems and methods described above allow improving the low-frequency efficiency of a distributed-capacitance Alderman-Grant coil optimized for high-frequency use, with minimal degradation in performance for the high-frequency resonance. In some embodiments, the high frequency corresponds to a proton signal, while the low frequency corresponds to a lock (e.g. deuterium) or other NMR (e.g. nitrogen or carbon) signal. In one application, improved lock NMR signal efficiency is achieved when the distributed capacitance coil is dual-tuned to both proton and deuterium lock frequencies. In another application, the upper or lower frequency resonance of the coil is broadband-tuned.

Splitting a lower capacitance band into a fixed part and a slidable part (parts 92*b* and 92*a*, respectively, in FIG. 3) allows tuning the high-frequency coil resonance while maintaining a RF current path close to the coil window/sample measurement volume (shown at 31 in FIG. 2). A split capacitance band can be used with or without the top auxiliary inductors and associated components described above, but is of particular use in a system employing auxiliary inductors since it allows recovering some high-frequency performance lost because of the addition of the auxiliary inductors. Maintaining a RF current path close to the coil window allows retaining the coil's high-frequency performance (e.g. proton sensitivity) through an extended tuning range. A split capacitance band can be of particular use in systems in which the proton resonant frequency is tuned by altering the capacitance(s) of one or more variable capacitors connected across the coil or between the coil and ground. In such a system, the circuit proton Q and filling factors may fall as the coil is tuned lower in frequency. Using a split capacitance band in such a system allows maintaining desired Q factors and RF magnetic field shifts across a required tuning range.

In some embodiments, systems and methods using auxiliary inductors as described above allowed improving the lock sensitivity by over 300%, as compared to a similar coil without the upper auxiliary inductors. The improved lock efficiency allows using shorter NMR signal pulse durations, and higher pulse powers. Increased lock sensitivity also allows an improvement in the shimming operation of the NMR system, by making the lock channel less noisy: if the NMR instrument is shimmed using the lock signal, the shimming process is easier and faster at higher lock signal signal-to-noise ratios, particularly for samples having low spin densities of locking (e.g. deuterium) nuclei. An automated shimming algorithm may require lower number of transients to achieve a desired signal-to-noise ratio. In addition, using a split capacitance band as described above was observed to improve high-frequency (e.g. proton) sensitivity.

In some embodiments, central coil structure 30 is formed from a single susceptibility-compensated thin conductive foil. The foil can include one or multiple layers of material, and is monolithic along its main surface plane. Susceptibility compensation reduces magnetic field inhomogeneities and associated lineshape distortions. A susceptibility-compensated foil can include multiple materials (e.g. layers) having different magnetic susceptibilities. For example, a layer having a positive susceptibility and a layer having a negative susceptibility can be stacked to generate a two-layer foil having a net susceptibility close to that of air. The net susceptibility of coil structure 30 is preferably close to the susceptibility of the environment of coil 30.

In some embodiments, central coil structure 30 and shields 32*a–b* are made of susceptibility-compensated palladium-plated copper. In general, other materials such as rhodium, platinum, copper and stacks of such materials are suitable for central coil structure 30 and shields 32a–b. For example, a Rh—Cu susceptibility-compensated sandwich can be used. Other materials having susceptibilities of opposite signs can be used to yield a magnetic susceptibility equal to the magnetic susceptibility of air or vacuum. In some embodiments, the overall transverse size of rings 40a–b and shields 32a–b is on the order of 1 cm. For typical NMR applications, transverse coil sizes for coil 30 can range from a few millimeters to a few centimeters. The longitudinal extents of longitudinal conductors 46a–b and rings 40a–b can be on order of a few cm. In some embodiments, coil supports 82, 86 are preferably made of a dielectric material that does not interfere with NMR measurements, such as glass, while inductor support 34 is made of a plastic or ceramic material.

In an exemplary embodiment, leads 48 have a longitudinal extent (length) of about 0.61", while the rest of coil structure 30 has a length of about 1.63". Leads 48 are preferably made as thin as mechanically feasible, in order to maximize their inductance and minimize their capacitance. In an exemplary embodiment, leads 48 are 0.02" wide and 0.002" thick.

Leads 48 are preferably straight, generally-longitudinal strips. The thin, straight geometry of leads 48 is chosen to maximize the impedance to high-frequency proton current, so that the circuit extension defined by leads 48 and inductors 36a–b (FIG. 2-A) has a minimal impact on the coil proton filling factor. The thickness and width of leads 48 can be limited by the foil cutting technique or mechanical stability requirements for the assembled coil, which can place lower bounds on the width of leads 48. Preferably, the width of leads 48 is less than or equal to about 1 mm. In some embodiments, leads 48 can have a meandering or other non-straight shape exhibiting a higher inductance than a linear shape. Such geometries also add to the capacitance between leads 48 and shield 32b (FIG. 2-A), which reduces the impedance presented to proton current. For example, a meandering shape for leads 48 was calculated to lead to lower proton filling factors than a straight shape, for the chosen geometry and dielectric properties of support 86 (FIG. 3-A). Leads 48 and 38 are soldered together at the top end of leads 48, as far away from the coil window as practicable. Preferably, coil assembly 24' does not include materials that can contribute to a proton background signal or dielectrically lossy materials.

Auxiliary inductors 36a–b are separated from upper ring 40b by a susceptibility-isolation distance. The susceptibility isolation distance is chosen to be sufficiently large that magnetic susceptibility inhomogeneities do not substantially affect linewidth. Linewidth is not affected if shimming can adequately compensate for higher-order perturbations to the static magnetic field due to magnetic susceptibility variations introduced by the auxiliary inductors. In general, the isolation distance is determined by the degree of susceptibility perturbation introduced by auxiliary inductors 36a–b. In some embodiments, a susceptibility isolation distance larger than or equal to about 1 cm (about 0.5 cm) was observed to be sufficiently large to provide adequate isolation of the RF measurement space from susceptibility variations introduced by the auxiliary inductors. In some systems, such an isolation distance is roughly equal to the coil diameter. In some embodiments, distances larger than or equal to 0.5 cm or 2 cm can provide a desired level of isolation. In embodiments using coil supports such as the cylindrical dielectric supports 82, 86 (FIG. 3), the minimum length of leads 48 (FIG. 2-A) can be limited by the length that supports 82, 86 extend above upper ring 48.

In an exemplary implementation, each auxiliary inductor 36a–b has an inductance value of about 150 nH. In other embodiments, exemplary inductance values include 90 nH and 200 nH. The inductance of inductors 36a–b (FIG. 2-A) is preferably chosen to be sufficiently high that proton performance is not excessively attenuated. Inductors 36a–b are preferably self-resonant above the proton frequency. For example, in an embodiment in which the proton resonant frequency is about 800 MHz, inductors 36a–b are chosen such that their self-resonant frequency is 850–900 MHz or higher. At the same time, if the inductance of inductors 36a–b is too high, lock performance starts to degrade. The lock circuit becomes harder to tune, because the combined inductance of the lock circuit (given primarily by inductors 36a–b and by two inductors situated at drive points below the coil) makes the lock signal resonate below the desired lock nucleus frequency. If auxiliary inductors 36a–b with a relatively high inductance are used, a lock shunt inductor (inductor 293 in FIG. 5-A) can be added across the proton leads at the bottom of coil assembly 24', to increase the self-resonance frequency of the lock circuit without significantly degrading proton sensitivity. In an exemplary implementation, each lower lock inductor 292a–b has an inductance value of about 100 nH. Generally, lower lock inductors 292a–b are preferably chosen to have a minimum inductance that allows a desired (e.g. −20 dB) level of isolation between the proton and lock ports at the proton frequency.

Inductors 36a–b preferably have identical inductance values and are inductively coupled to each other, in order to preserve the RF field homogeneity of coil assembly 24' by allowing similar currents to flow on both sides of the coil. If the two inductors are not identical and are not mutually coupled, a split-mode solution can result in RF field inhomogeneities. Inductors 36a–b carry both lock current and some proton current, and are preferably shielded from any lossy materials or sample present outside of the sample measurement volume, which is the homogeneous region of the static magnetic field. Furthermore, inductors 36a–b are preferably not exposed to any materials that generate a proton background signal. A susceptibility-compensated metal shield can also be used to surround any sample present above upper shield 32b. In some embodiments, a high-pass circuit, series capacitance or other circuit can be inserted in the center of one or both lock inductors 36a–b, in order to attenuate low-frequency currents such as currents caused by gradient switching.

Figure 7:
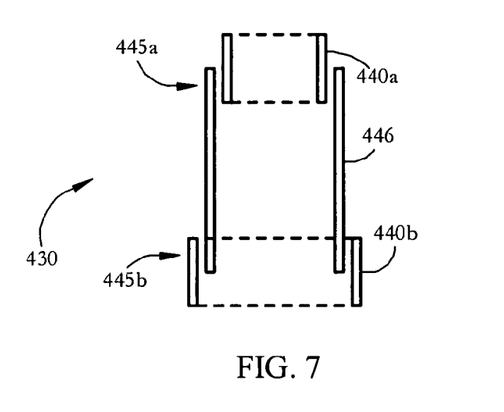
FIG. 7 shows a side view of a coil structure having a ring that is physically distinct, and coupled capacitively, to longitudinal conductors of the coil structure, according to some embodiments of the present invention.
Figure 8:
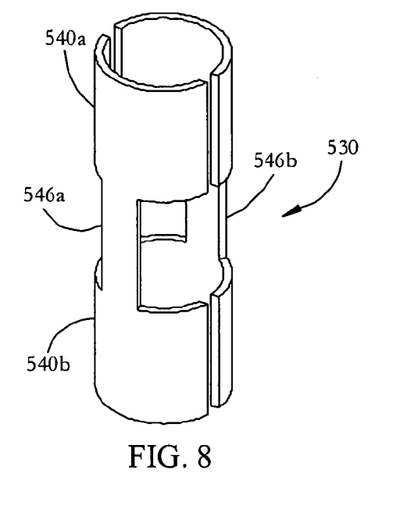
FIG. 8 shows an Alderman-Grant coil shape according to some embodiments of the present invention.

FIG. 7 shows a side view of a saddle-shaped coil structure 430 having two longitudinally-spaced cylindrical rings 440a–b that are physically distinct from (not resistively coupled to) a set of longitudinal conductors 446, according to some embodiments of the present invention. Rings 440a–b are capacitively coupled to conductors 446 along overlap regions 445a–b, respectively. Rings 440a–b can be formed by at least part of an RF coil shield or capacitance band, for example. FIG. 8 shows an Alderman-Grant coil structure 530 according to some embodiments of the present invention. The coil thickness is exaggerated in FIG. 8 for clarity of display. Coil structure 530 includes an upper ring 540a and a lower ring 540b each having two oppositely-positioned longitudinal slots. Rings 540a–b are interconnected by two continuous (un-slotted) longitudinal conductors 546a–b.

The following examples are intended to illustrate aspects of some embodiments of the present invention, and should not be construed to limit the invention.

Several tests were performed on an NMR system using split movable capacitance bands as illustrated in FIGS. 3 and 5-A–C, and on a comparable NMR system having a single, fixed lower capacitance band having the same longitudinal extent as the combined longitudinal extents of lower capacitance bands 92a–b (FIG. 3).

A fixed-band coil was tuned to proton and lock frequencies, and placed in a probe; no X-coil was used. The proton resonance was tuned to 800 MHz using a conventional tuning circuit including a variable capacitor placed below the lower insulator. The proton pulse width was evaluated on a dilute doped water sample. A similar experiment was performed on a split-capacitance-band coil as shown in FIGS. 3 and 5-A–C. The split-capacitance-band coil was tuned to proton by sliding the lower capacitance band. At the same power setting, the 90 degree pulse durations were observed to be 6.47 µs for the fixed-capacitance-band coil, and 6.05 µs for the split-capacitance-band coil. A comparison of 90 degree pulse widths between the fixed-capacitance-band coil and the coil having split movable capacitance bands showed a 7% improvement for the split-capacitance-band coil. Since the power used was the same in both tests, using a sliding cap band can be inferred to be capable of yielding a 7% improvement in sensitivity over a single-band coil using a variable capacitor for tuning.

In a series of measurements, the Q-factors and resonance frequency shifts for a split-band and a comparable single-band (conventional) coil were recorded across a tuning frequency range. The performance of an NMR antenna can be evaluated by measuring the Q of the probe and the shift in resonance frequency when a conductive cylinder is introduced in the RF coil in the location where a sample experiences the $B_1$ field. For coils of similar geometry, the NMR sensitivity may be evaluated by the square root of the frequency shift multiplied by the Q. Therefore, comparisons between coil Q-factor and frequency-shift measurements can be used as a bench test to compare coil performance. Such a comparison was performed for a split-band coil and a comparable single-band coil, across the tuning range of the probe.

Figure 9:
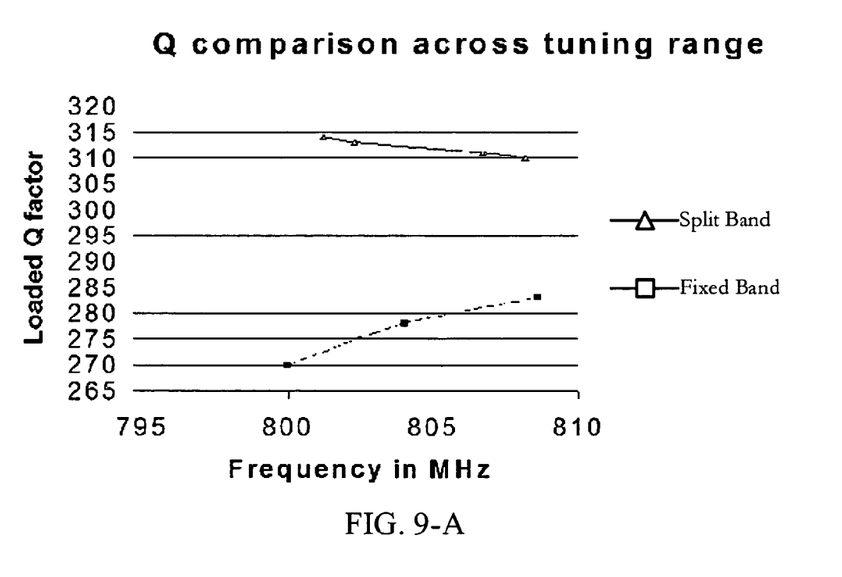

FIG. 9-A shows measured coil Q factors for a split-band and a comparable single-band (conventional) coil. As illustrated, the single-band coil displays lower Q-factors as the resonant frequency is reduced. Reducing the resonant frequency of the single-band coil corresponds to an increase in the tuning capacitance added by a variable capacitor in the tuning circuit. The split-band coil displays higher Q-factor as its resonance frequency is reduced. The best Q-factor for the split-band coil occurs when the sliding band is closest to the RF window, which corresponds to the lowest frequency and highest capacitance along the tuning range. As the sliding band is withdrawn, a small fraction of the RF current flows away from the RF window, slightly reducing the coil Q-factor. The fixed portion of the split capacitance band, which remains on the coil window, limits the Q-factor losses. Much larger reductions in Q-factor were seen when an entire single capacitance band was slid away from the RF window.

FIG. 9-B shows measured $B_1$ shift variations for a split-band and a comparable single-band (conventional) coil. The $B_1$ shift for the conventional coil was observed to decrease with probe tune frequency. For a conventional coil connected to a tuning capacitor, the filling factor and $B_1$ shift decrease as current increases in the coil leads which connect the tuning capacitor. In contrast, the filling factor remains largely constant for the split-band coil, as the tuning takes place very close to the RF window of the coil.

FIG. 9-C shows efficiency values for the two coils, computed according to the relation Efficiency=Sqrt ($Q*B_1$ shift) using the data shown in FIGS. 9-A–B. The single-band coil displays some degradation in probe performance as the tune frequency is lowered. The split-band coil exhibits a much smaller efficiency change with frequency, and overall a higher efficiency. The data of FIG. 9-C indicate that the performance improvement of a split-band coil depends on the amount the sample loads the RF coil and therefore the re-tuning correction needed to resonate the probe at the frequency of interest.

The above embodiments may be altered in many ways without departing from the scope of the invention. For example, the capacitance bands can be provided inside, rather than outside the RF coil. The capacitance bands can include longitudinal or transverse slots, or other geometrical features or patterns. An electrical isolation structure can include a piece of insulator in addition to or instead of the isolation capacitor described above. Such an isolation structure can be placed within or form part of the coupling member, rather than between the coupling member and the piston actuator. Accordingly, the scope of the invention should be determined by the following claims and their legal equivalents.

What is claimed is:

1. A nuclear magnetic resonance apparatus comprising a nuclear magnetic resonance radio-frequency coil, the coil comprising:
   a distributed-capacitance central coil structure comprising
   a pair of longitudinally-spaced conductive rings including
      a first band-shaped ring and a second band-shaped ring, wherein a coil window is defined in a space between the first ring and the second ring, and
   a plurality of longitudinal conductive segments each electrically interconnecting the first ring to the second ring;
   a first ring-shaped capacitance band overlapping the first ring and having a first diameter; and
   a second ring-shaped capacitance band, wherein the second capacitance band has a second diameter substantially equal to the first diameter, is situated adjacent to the first ring-shaped capacitance band on the same side of the coil window as the first capacitance band and distant from the coil window, and is longitudinally-movable between a proximal position and a distal position, the distal position being situated further away from the coil window than the proximal position, wherein the second capacitance band in the proximal position overlaps the first ring, and wherein longitudinally moving the second capacitance band tunes a resonance frequency of the coil.

2. The apparatus of claim 1, further comprising a longitudinal coupling member rigidly coupled to the second capacitance band and extending away from the first capacitance band.

3. The apparatus of claim 2, further comprising a longitudinal-motion actuator connected to the longitudinal coupling member, for driving a longitudinal motion of the second capacitance band between the proximal position and the distal position.

4. The apparatus of claim 3, further comprising an electrically non-conductive isolation structure coupled to the longitudinal coupling member, for electrically isolating the second capacitance band from an external environment of the longitudinal coupling member.

5. The apparatus of claim 2, wherein the longitudinal coupling member comprises a longitudinal susceptibility-compensated rigid wire.

6. The apparatus of claim 2, further a comprising a generally-transverse lower insulator disposed underneath the radio-frequency coil, wherein the longitudinal coupling member passes through a longitudinal aperture defined through the lower insulator.

7. The apparatus of claim 1, further comprising a longitudinal-motion actuator coupled to the second capacitance band, for driving a longitudinal motion of the second capacitance band between the proximal position and the distal position.

8. The apparatus of claim 1, wherein the first capacitance band is adjacent to the coil window.

9. The apparatus of claim 8, wherein the second capacitance band in the proximal position abuts the first capacitance band.

10. The apparatus of claim 1, further comprising a first cylindrical dielectric support, wherein the central coil structure is mounted along an inner side of the first dielectric support, and the first capacitance band and the second capacitance band are mounted on an outer side of the first dielectric support.

11. The apparatus of claim 10, further comprising a second cylindrical dielectric support wherein the central coil structure is amount along an outer side of the second dielectric support.

12. The apparatus of claim 11, further comprising a first cylindrical conductive shield overlapping the first ring and mounted along an inner side of the second dielectric support, and a second cylindrical conductive shield overlapping the second ring and mounted along the inner side of the second dielectric support.

13. The apparatus of claim 1, further comprising a third capacitance band overlapping the second ring.

14. The apparatus of claim 1, wherein the first ring is a lower coil ring.

15. The apparatus of claim 1, further comprising a nuclear magnetic resonance magnet enclosing the coil.

16. The apparatus of claim 1, wherein the nuclear magnetic resonance radio frequency coil is a modified Alderman-Grant saddle-shaped coil.

17. A capacitance band assembly for tuning a nuclear magnetic resonance radio-frequency coil, comprising:
  a first ring-shaped capacitance band sized to overlap a band-shaped part of the coil;
  a second ring-shaped capacitance band sized to overlap the band-shaped part of the coil, the second capacitance band being longitudinally-movable between a proximal position and a distal position, the distal position being situated further away from the first capacitance band than the proximal position, the second capacitance band in the proximal position being adjacent to the first capacitance band and overlapping the band-shaped part of the coil;
  a longitudinal coupling member rigidly coupled to the second capacitance band and extending away from the first capacitance band; and
  a longitudinal-motion actuator connected to the longitudinal coupling member for driving a longitudinal motion of the second capacitance band between the proximal position and the distal position.

18. A nuclear magnetic resonance method comprising:
tuning a nuclear magentic resonance radio-frequency coil by moving a second ring-shaped capacitance band between a proximal position and a distal position, wherein the second capacitance band overlaps a band-shaped part of the nuclear magnetic resonance radio-frequency coil in the proximal position, a first ring-shaped capacitance band overlaps the band-shaped part of the coil; the distal position is situated further away from the first capacitance band than the proximal position; and
using the coil to perform a nuclear magnetic resonance measurement on a sample.

\* \* \* \* \*